United States Patent [19]

Ohashi et al.

[11] Patent Number: 4,683,186

[45] Date of Patent: Jul. 28, 1987

[54] DOPED AMORPHOUS SILICON PHOTOCONDUCTIVE DEVICE HAVING A PROTECTIVE COATING

[75] Inventors: Kunio Ohashi; Tadashi Tonegawa, both of Nara; Shoichi Nagata, Yamatokoriyama; Masatsugu Nakamura, Nara, all of Japan

[73] Assignee: Sharp Kabushiki Kaisha, Osaka, Japan

[21] Appl. No.: 786,046

[22] Filed: Oct. 10, 1985

Related U.S. Application Data

[62] Division of Ser. No. 706,669, Feb. 28, 1985, Pat. No. 4,632,894.

[30] Foreign Application Priority Data

| Feb. 28, 1984 | [JP] | Japan | 59-39147 |
| Mar. 2, 1984 | [JP] | Japan | 59-40938 |
| Mar. 2, 1984 | [JP] | Japan | 59-40939 |
| Mar. 5, 1984 | [JP] | Japan | 59-42662 |
| Mar. 5, 1984 | [JP] | Japan | 59-42663 |
| Mar. 5, 1984 | [JP] | Japan | 59-42664 |
| Mar. 14, 1984 | [JP] | Japan | 59-49675 |
| Mar. 14, 1984 | [JP] | Japan | 59-49676 |

[51] Int. Cl.$^4$ .................... G03C 5/08; G03C 5/04
[52] U.S. Cl. .................... 430/84; 252/501.1; 357/2; 427/74; 430/63; 430/66; 430/67; 430/95
[58] Field of Search .................... 430/66, 67, 84, 95, 430/63; 427/74; 357/2; 252/501.1

[56] References Cited

U.S. PATENT DOCUMENTS

| 4,394,425 | 7/1983 | Shimizu et al. | 430/60 |
| 4,409,308 | 10/1983 | Shimizu et al. | 430/60 |
| 4,414,319 | 11/1983 | Shirai et al. | 430/95 |
| 4,460,669 | 7/1984 | Ogawa et al. | 430/85 |
| 4,461,820 | 7/1984 | Shirai et al. | 430/65 |
| 4,471,042 | 9/1984 | Komatsu et al. | 430/95 |
| 4,486,521 | 12/1984 | Misumi et al. | 430/95 X |
| 4,490,454 | 12/1984 | Misumi et al. | 430/95 |

*Primary Examiner*—John E. Kettle
*Assistant Examiner*—Mukund J. Shah
*Attorney, Agent, or Firm*—Birch, Stewart, Kolasch & Birch

[57] ABSTRACT

A photoconductive device including a conductive substrate, a photoconductive layer of amorphous silicon containing at least hydrogen and a surface protection layer applied on the photoconductive layer a dopant is added in the photoconductive layer at least near the interface with the surface protection layer, and the concentration of the dopant increases in the direction perpendicular to the interface. The surface protection layer has an optical energy gap larger than that of the photoconductive layer.

A further photoconductive device comprising a conductive substrate; a photoconductive layer of amorphous silicon applied on the conductive substrate and a surface protection layer of amorphous silicon applied on said photoconductive layer wherein the surface protection layer contains oxygen, and is doped with a IIIb element.

28 Claims, 13 Drawing Figures

DOPED AMORPHOUS SILICON PHOTOCONDUCTIVE DEVICE HAVING A PROTECTIVE COATING

BACKGROUND OF THE INVENTION

This application is a divisional of copending application Ser. No. 706,669, filed on Feb. 28, 1985, now U.S. Pat. No. 4,632,894.

FIELD OF THE INVENTION

The present invention relates to a photoconductive device which is sensitive to light and can be used, for example, as a xerographic photoconductor and as a photoconductive layer applied in apparatuses such as a manuscript read-out apparatus.

PRIOR ART

Heretofore, the following photoconductive materials have been used to constitute a photoconductive device: inorganic materials such as selenium, cadmium sulfide, and zinc oxide, and organic materials such as polyvinyl carbazole and trinitrofluorenone.

Figure 1:
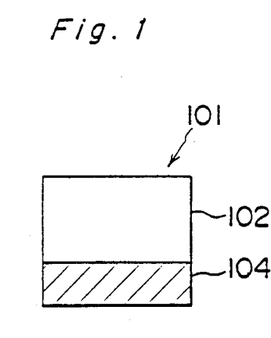
FIG. 1 is a schematic cross-section of a photoconductive device.

FIG. 1 shows schematically a photoconductive device 101 composed of a conductive substrate 104 and a photoconductive layer 102 applied on the substrate 104.

However, those photoconductive materials do not necessarily satisfy all the following properties required for a photoconductive device: photosensitivity, spectroscopic sensitivity, the SN ratio (light resistance/dark resistance), durability and safety (danger) for a human body. Therefore, they have been applied each in optimum occasions by relaxing one or more requirements to some extent.

Recently, the amorphous silicon (hereinafter referred to as a-Si, wherein "a-" means "amorphous") photoconductive device has been studied largely due to advantages of high photosensitivity, high durability and harmlessness. However, a-Si photoconductive material has many points to be improved further.

For example, the SN ratio is not high enough because the dark resistance is low. Then, if an a-Si photoconductive layer is used as a xerographic photoconductor, sufficient surface potential cannot be obtained due to the low dark resistance, and the contrast of the electric potential is not clear. Then, the image concentration has often been inappropriately low.

Furthermore, as an a-Si xerographic photoconductor is re-used repeatedly, the amount of damage such as scratches, increases and point-like defects appear in a copy of an image. Repeated operations gradually make an image in a copy dim.

Especially, it should be noted that the surface of a-Si is unstable. The unstability deteriorates environmental resistance, such as moisture resistance, as well as secular stability. If an a-Si xerographic photoconductor is allowed to be out of operation for a long period, the image of the copy becomes dim.

It is an object of the present invention to provide a photoconductive device made from a-Si-based material and having improved characteristics, especially high dark resistance, so as to make the S/N ratio (dark resistance/light resistance) large.

It is another object of the present invention to provide a photoconductive device which is excellent especially in stability, environment resistance and secular stability.

It is a further object of the present invention to provide a photoconductive device which has a hard surface and adheres to the substrate well.

SUMMARY OF THE INVENTION

In accordance with the present invention, a new photoconductive device is provided which comprises:
a conductive substrate; and
a photoconductive layer applied on the conductive substrate, which photoconductive layer is made of amorphous silicon containing at least hydrogen, wherein the photoconductive layer contains hydroxy radicals.

In accordance with the present invention, another new photoconductive device is provided which comprises:
a conductive substrate;
a photoconductive layer of amorphous silicon containing at least hydrogen; and
a surface protection layer applied on the photoconductive layer;
wherein a dopant is added in the photoconductive layer at least near the interface with the surface protection layer, and the concentration of the dopant increases in the direction perpendicular to the interface; and the surface protection layer has the optical energy gap larger than that of the photoconductive layer.

It is an advantage of the present invention to provide a photoconductive device, which can be used, for example, as a xerographic photoconductor. Especially, when used as a xerographic photoconductor, an image can be reproduced with high concentration and with high resolution, and a half-tone image can be obtained clearly.

BRIEF DESCRIPTION OF THE DRAWINGS

Embodiments of the invention will now be described by way of examples and with reference to the accompanying drawings, in which:

FIGS. 10(a)-(e) are schematic energy diagrams of a photoconductive device;

FIGS. 12(a)-(f) are graphs of the distribution of boron (solid line) and another element such as oxygen, nitrogen and carbon (dashed line) in a photoconductive device; and FIGS. 13(a)-(f) are graphs of the distribution of phosphorous (solid line) and another element such as oxygen, nitrogen and carbon (dashed line) in a photoconductive device.

DETAILED DESCRIPTION

One solution (shown in Example 1) to overcome the disadvantages mentioned in the introduction is to add chemical modifiers to an a-Si photoconductive layer. From the standpoint of the improvement of environment resistance and secular stability, the addition of chemical modifiers, such as oxygen, nitrogen and carbon is appropriate. Unfortunately, the inventors found that the characteristics for a photosensitive material cannot be improved. On the contrary, the inventors found that the addition of hydroxy radicals is effective.

Figure 3:
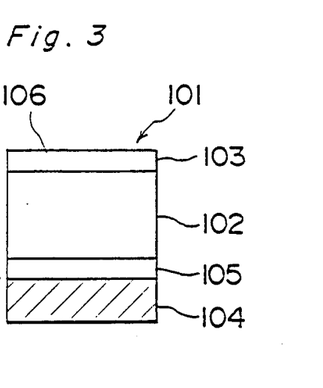
FIG. 3 is a schematic cross-section of a photoconductive device with an undercoat layer.

Another solution (shown in Examples 2-8) to overcome the disadvantages is to apply a surface protection layer or a surface blocking layer to the surface of an a-Si photoconductive layer. A surface protection layer 103 covers a photoconductive layer 102 as shown in a schematic cross-section of a photoconductive device 101 (FIG. 1), wherein a photoconductive layer 102 is applied on a conductive substrate 104, and a surface protection layer 103 covers the photoconductive layer 102; the surface protection layer 103 has a free surface 106. FIG. 3 shows another schematic cross-section of a photoconductive plate 101 having a surface protection layer 103, wherein an undercoat layer 105 is interposed between the substrate 104 and the photoconductive layer 102 in order to improve the adhesion between them. The undercoat layer 105 prevents not only the fall-off of deposited films from the conductive substrate 104, but also the injection of carriers from the conductive substrate 104.

However, a surface protection layer is liable to deteriorate properties important for a photosensitive material such as charge acceptance, photosensitivity and residual potential. If a surface protection layer is formed as an electrically insulating film (by decreasing the composition ratio x) in order to improve environment resistance and secular stability, the photosensitivity deteriorates and the residual electrical potential rises. Then, for example, photographic fogging happens in a copy. On the contrary, if the photoconductivity of a surface protection layer is made higher (by increasing x), the environment resistance and the secular stability deteriorate though the residual potential decreases.

On the other hand, as will be explained in Examples 2-8, a photoconductive device can be produced covered with a surface protection layer which does not deteriorate the photoconductor characteristics.

A photoconductive device can be produced as follows:

Amorphous silicon can usually be formed on a conductive substrate with a deposition process such as the glow discharge process, the sputtering process, the ion plating process and the vacuum deposition process.

A conductive substrate is made of stainless steel, aluminum, chromium, molybdenum, gold, iridium, niobium, tantalum or an alloy of the abovementioned metals.

If a flexible conductive substrate is needed, an appropriate metal among the abovementioned metals is applied to a film sheet of synthetic resin by using the vacuum deposition process, the sputtering process, or the laminating process. Next, a process of depositing a photoconductive layer on the flexible conductive substrate follows.

In the glow discharge process which has been used in following Examples 1-8, silicon hydrides such as $SiH_4$, and $Si_2H_6$ are introduced in a deposition apparatus under vacuum, and are discharged under low pressure so that they are decomposed with the discharge energy and are deposited with the discharge energy on a substrate placed in the deposition apparatus.

A process of adding chemical modifiers such as hydrogen, oxygen, nitrogen, carbon and hydroxy radical to a-Si are as follows.

Hydrogen will be added simultaneously at the deposition of a-Si because the starting materials for the deposition of a-Si are silicon hydrides such as $SiH_4$, $Si_2H_6$; the hydrides are decomposed with the discharge so as to form a-Si:H. In other words, a-Si deposited in this process contains at least hydrogen. If it is necessary to add hydrogen more effectively, hydrogen gas will be introduced in the deposition apparatus.

In case of adding oxygen, the oxygen gas is introduced in the deposition process. Because the oxygen and gases such as $SiH_4$ react vigorously in the gas phase, the former should be introduced via a path different from that of the other gases.

Nitrogen or carbon can be added to a-Si only by introducing nitrogen gas or a gas of nitride or carbide such as ammonia ($NH_3$), mathane ($CH_4$), and acetylene ($C_2H_2$)

Dopants are added in order to control the type of carrier in a-Si. Doping of accepters such as a IIIb element, boron, and of doners such as a Vb element, phosphor, makes the type of carriers the p-type and the n-type, respectively. Boron or phosphor is conventionally doped by introducing diborane ($B_2H_6$) or phosphine ($PH_3$) in the deposition apparatus. The amount of the addition of the dopant is determined according to the electrical and optical properties to be required.

Figure 4:
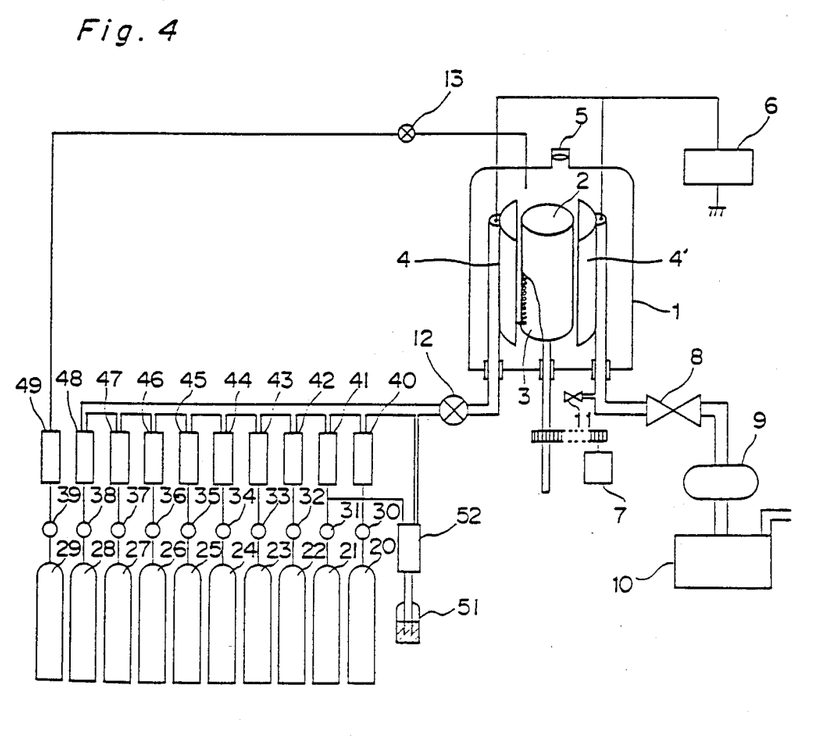
FIG. 4 is a diagram of the deposition apparatus.

FIG. 4 shows a deposition apparatus for the glow discharge process. An aluminum substrate 2 of diameter 140 mm and length 340 mm is secured on a drum heater 3 which can be rotated in a reaction chamber 1 with a drive motor 7. The surface of the aluminum substrate 2 has been washed sufficiently in a chlorocen supersonic washer and a steam cleaner (not shown). The drum heater 3 has the outer surface which coincides closely with the inner surface of the aluminum substrate 2, and it heats the surface of the aluminum substrate 2 homogeneously. The reaction chamber 1 has a small window 5.

A pair of discharge electrodes 4, 4' are placed beside the aluminum substrate 3 symmetrically relative to the substrate 3, and a high frequency power source 6 is connected to the electrodes.

The reaction chamber 1 can be evacuated via a valve 8 with a mechanical booster pump 9 and a rotary pump 10. A relief valve 11 is furnished in an evacuation pipe.

After opening valves 30-38, gases stored in gas cylinders 20-28 can be introduced in the reaction chamber 1 through an auxiliary valve 12 under the control of mass flow controllers 40-48, respectively. The gas cylinder 20 contains silane ($SiH_4$), while the gas cylinder 21 is filled with hydrogen. The gas cylinders 22 and 23 contain 400 ppm 1% diborane mixed with hydrogen, respectively, while the gas cylinder 24 contains 600 ppm of phosphine mixed with hydrogen. The gas cylinders 25 and 26 are filled with ammonia ($NH_3$) and methane ($CH_4$), respectively. The gas cylinders 27 and 28 contain silicon tetrafluoride ($SiF_4$) and carbon tetraflouride ($CF_4$), respectively.

Oxygen gas in a gas cylinder 29 can be introduced through a different line via a valve 39 and an auxiliary valve 13 under the control of a mass flow controller 49.

Methyl alcohol is used in order to add hydroxy radicals to a-Si. Because methyl alcohol is liquid under room temperature, hydrogen gas supplied from the gas cylinder 21 is introduced in a bubler 51, wherein the hydrogen gas bubbles through the methyl alcohol contained in the bubler 51 and carries methyl alcohol gas to the reaction chamber 1 under the control of a controller 52 which regulates the ratio of methyl alcohol to hydrogen.

A photoconductive layer 102 can be deposited on a conductive substrate 104 as follows. The air in the reaction chamber 1 is evacuated via the valve 8 with the mechanical booster pump 9 and the rotary pump 10, and the aluminum substrate 2 is heated by the drum heater 3 until the temperature of the surface of the aluminum substrate 2 increases to 250° C. and is kept constant thereafter.

Then, gases composed of silane, hydrogen and others to be mixed, for example diborane, are allowed to flow to the reaction chamber 1 by opening the auxiliary valve 12 and the valves 30, 31 and 32. The set points of the mass flow controller 40, 41 and 42 are increased gradually to predetermined values. The pressure in the reaction chamber 1 is kept at 1.5 Torr by controlling the opening of the valve 8.

Next, the high frequency power source 6 is switched on to apply a voltage of high frequency 13.56 MHz to the pair of discharge electrodes 4, 4'. Thus, the glow discharge begins, and an a-Si film is deposited on the aluminum substrate heated as mentioned above. The high frequency power is controlled at 400 W during the deposition process.

On the deposition of an a-Si film, diborane or phosphine is added in order to control the carrier type of the a-Si film. For example, the flow of diborane is controlled with the mass flow controller 42 so that the ratio of the concentration of diborane to that of silane becomes $10^{-4}$. If the amount of diborane is high, the carrier type becomes p-type or p+-type, while if low, the carrier type becomes n-type or i-type. As for the dark resistance ratio and the photosensitivity, a very small amount of oxygen, methane or ammonia is added in order to improve them to predetermined values.

After forming an a-Si layer, the high frequency source 6 is switched off, the valves 30, 31, 32 and 12 are closed, and the drum heater 3 is switched off to cool down gradually.

After the aluminum substrate 2 is removed, carbon tetrafluoride gas in the gas cylinder 28 is introduced in the reaction chamber 1 under the control of the mass flow control 26 in order to clean the reaction chamber 1.

PREFERRED EMBODIMENTS

EXAMPLE 1

Electrical and optical properties of an a-Si photoconductive device can be controlled by adding chemical modifiers such as oxygen, nitrogen and carbon. However, the addition of those chemical modifiers cannot increase both dark resistance and photoconductivity gain at the time; the improvement of one of both properties accompanies the deterioration of the other.

A photoconductive device of double layer structure shown in FIG. 1 is formed wherein hydroxy radicals are added in the photoconductive layer 102. Molecules which has a hydroxy radial are mixed with silane or disilane and are introduced in the reaction chamber 1 in order to add hydroxy radicals to a-Si. Such molecules are, for example, alcohols such as methyl alcohol and ethyl alcohol and fatty acids such as acetic acid.

It is possible to add a dopant to a-Si at the same time in order to control the carrier type of the photoconductive layer.

If the molecule having a hydroxy radical is liquid at room temperature, it is necessary to use a mass flow controller of the liquid vapor control type. If water is added, it is especially needed to control both purity and flow rate because of the large activity of water.

In this Example, because methyl alcohol is liquid at room temperature, carrier gas, that is, hydrogen gas from the gas cylinder 21 is introduced in the bubler 29 which contains methyl alcohol. The controller 49 controls the ratio of methyl alcohol to hydrogen as a predetermined ratio. The gas is introduced in the reaction chamber 1 as well as silane, hydrogen, diborane and silicon tetrafluoride from the gas cylinders 20, 21, 22 and 27. The photoconductive layer 102 is deposited with the glow discharge process as mentioned above, and the deposition rate is about 2.0 $\mu$m/hr. By depositing during eight hours, an a-Si film of thickness 16 $\mu$m are formed on a conductive substrate.

Figure 5:
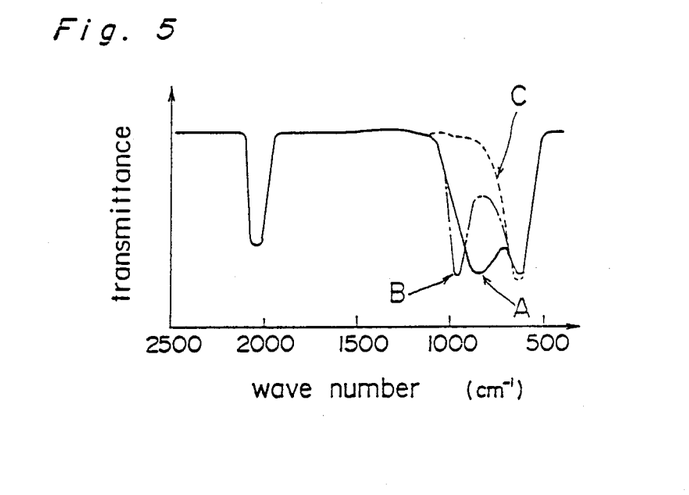
FIG. 5 is a graph of the light absorption of photoconductive devices.

FIG. 5 plots the transmittance I of a-Si layer against the wave number ($cm^{-1}$) of the incident light.

The curve A shows a typical transmittance curve of a-Si containing hydroxy radicals. Three absorption peaks appear: a first peak around 650 $cm^{-1}$ due to Si-H binding modes, a second peak due to Si-OH binding modes between 720 and 900 $cm^{-1}$ and a third peak between 2000 and 2100 $cm^{-1}$ due to Si-H and Si-$H^2$ binding modes. The amplitudes of the three peaks vary according to the preparation conditions. On the other hand, the curve B of a-Si containing oxygen has a second peak between 950 and 1050 $cm^{-1}$ at a different wave number range from that of the second peak of a-Si containing hydroxy radicals. The curve C shows for comparison the transmittance of a-Si not containing hydroxy radicals and oxygen; It is clear that the second absorption peak vanishes. This graph shows clearly that the addition of hydroxy radicals does not deteriorate the photoconductivity gain in spite of the increase in dark resistance as will be shown later. Thus, the S/N ratio (dark resistance/light resistance) becomes large with the addition of hydroxy radicals.

The a-Si containing hydrogen has the dark resistance as much as $10^9$-$10^{10}$ $\Omega$·cm. That is, the dark resistance is too low to be used for a xerographic photoconductor so that the surface potential is not high sufficiently. Then, the contrast of the potential in an electrostatic latent image becomes small, and the concentration of an image becomes small. Thus, a copy lacks clearness.

On the contrary, if the a-Si containing at least hydrogen is doped with hydroxy redicals, the dark resistance becomes high and the SN ratio (dark resistance/light resistance) also increases. It is found that the a-Si containing hydrogen and doped with hydroxy radicals not only can be used practically, but also has remarkably excellent properties such as the charge acceptance, the homogeneity and the durability.

Figure 6:
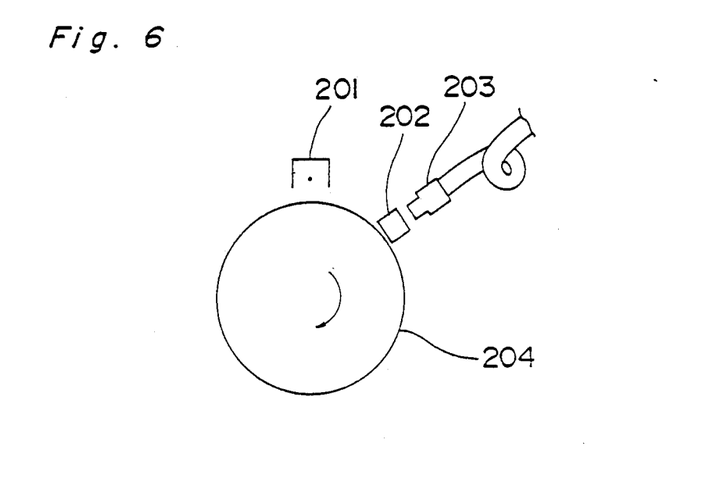
FIG. 6 is a diagram of an apparatus for test electrophotography characteristics.

The photoconductive layer 102 thus produced are examined with an electrophotography testing apparatus shown in FIG. 6 as for the characteristics as a photoconductor. The decay characteristics of the surface potential is measured with the apparatus wherein the photoconductor are adhered on a drum 204. After a charger 201 electrifies the rotating photoconductor, the drum 204 is stopped at the predetermined timing, and at the same time the decay characteristics of the surface potential is detected with a potential sensor of the light transmittion type under the illumination of light through an optical fiber 203.

At the measurements, the revolution of the drum 204 is controlled so that the surface velocity of the photoconductor is 150 mm/sec, and the dc positive voltage applied on the sensitizer 201 is controlled so that the amount of the charges in the photoconductor becomes $3 \times 10^{-7}$ coulomb/cm$^2$. Furthermore, the voltage applied to the source of light (a halogen lamp of the rating of 24 V and 200W) is controlled so that the light intensity at the outlet of the optical fiber 203 becomes 10 $\mu$W/cm$^2$.

Figure 7:
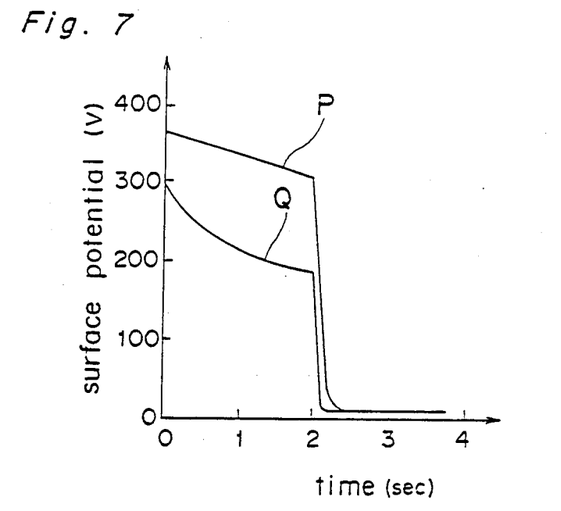
FIGS. 7-9 are graphs of physical properties of photoconductive devices.

The data on the photoconductivity will be explained below. FIG. 7 shows the time dependence of the surface potential (in Volt) of a photoconductor P which contains hydroxy radicals according to the present invention and that of a photoconductor Q which contains no hydroxy radicals. The photoconductor begins to be illuminated at two second, and the surface potential drops rapidly after that. The time dependence of the surface potential up to 2 second, that is decay of the charge in the darkness shows that the charge acceptance is remarkably improved in the photoconductor P according to the present invention.

Figure 8:
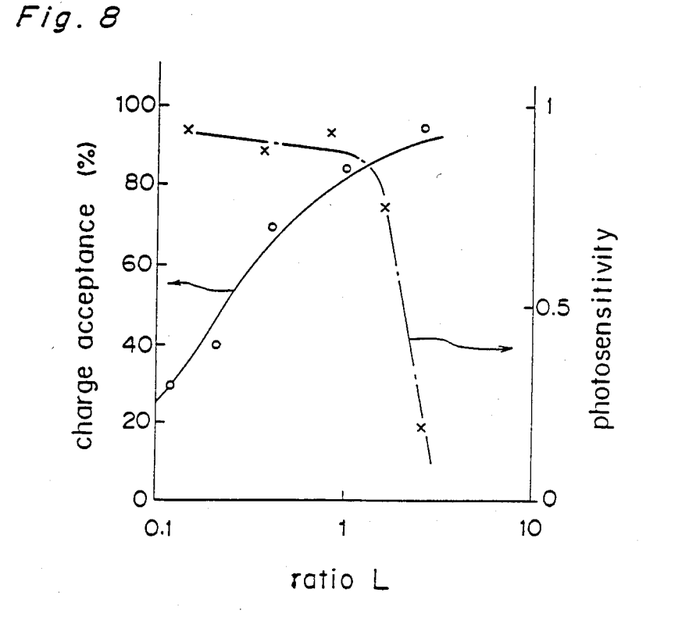

FIG. 8 shows the charge acceptance (%) and the photosensitivity of a photoconductor of thickness 16 $\mu$m against the amount of hydroxy radicals, which is expressed as a ratio L of the second peak to the first peak of the absorption intensity in the infrared absorption spectra, that is, a ratio of the absorption intensity at 860 cm$^{-1}$ to that at 650 cm$^{-1}$. The absorption intensity attains a maximum at 860 cm$^{-1}$ in the second peak and at 650 cm$^{-1}$ in the first peak, respectively. The second absorption peak between 720 and 920 cm$^{-1}$ is relevant to the existence of hydroxy radicals.

It is clear that the charge acceptance increases with increase in L (the amount of hydroxy radicals). However, the photosensitivity decreases if L becomes too large. Then, it is desirable that the ratio L is between 0.1 and 2 for a photoconductor.

Figure 9:
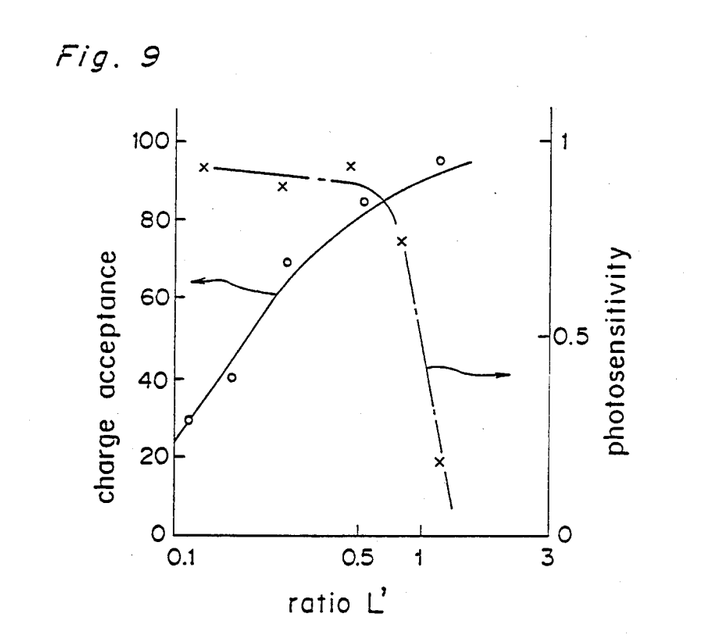

FIG. 9 shows another relation of both charge acceptance (%) and photosensitivity of a photoconductor of thickness 16 $\mu$m to the amount of hydroxy radicals which is expressed as a ratio L' of the second peak to the third peak of the absorption intensity in the infrared absorption spectra, that is, a ratio of the absorption intensity at 860 cm$^{-1}$ to that at 2050 cm$^{-1}$. The absorption intensity attains a maximum at 2050 cm$^{-1}$ in the third peak between 2000 and 2100 cm$^{-1}$.

It is desirable that the ratio L' (the amount of hydroxy radicals) is between 0.1 and 1.2 for a photoconductor. Similarly, the absorption intensities of many samples have been measured. Then, it is found that the ratio of a broad peak between 720 and 900 cm$^{-1}$ due to the Si-OH binding mode against that of a peak between 2000 and 2100 cm$^{-1}$ due to the Si-H and Si-H binding modes is desirably to be between 0.1 and 1.2 for a photoconductor.

The inventors found that the characteristics as a xerographic photoconductor cannot be improved by doping oxygen gas only, as will shown below. The characteristics of the infrared absorption of a photosensitive film containing oxygen differ from those of a photosensitive film containing hydroxy radicals. This is ascribable to the difference of the chemical bonds of hydroxy radicals in the film from those of oxygen atoms and the difference of the amount of the dopants.

Figure 2:
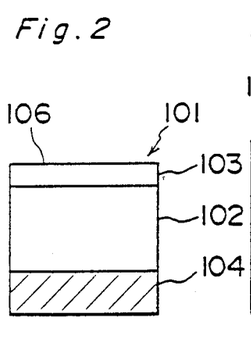
FIG. 2 is a schematic cross-section of a photoconductive device with a surface protection layer.

In the following Examples, a photoconductive device having a surface protection layer shown in FIGS. 2 and 3 is produced.

A surface protection layer should satisfy following requirements because it is applied on the surface of the photoconductive layer:

(a) The surface protection layer should not deteriorate the photosensitivity of the photoconductive layer. In other words, it should have small absorption coefficient of the visible light so as to transmit the visible light to the photoconductive layer because the photoconductive layer is composed of a material having large photosensitivity or large absorption coefficient of the visible light.

(b) The surface protection layer should not deteriorate the charge acceptance of the photoconductive layer. In other words, it should have high electrical resistance.

If a surface protection layer satisfies the abovementioned requirements (a), (b) as well as the environment resistance and the secular stability, a photoconductive device coated with the surface protection film can have high photosensitivity and high charge acceptance as well as excellent stability, environment resistance and secular stability.

In order to improve the environment resistance and the secular stability, a stable film of, for example, silicon carbide a-Si$_x$C$_{1-x}$, silicon nitride a-Si$_x$N$_{1-x}$, silicon oxide a-Si$_x$O$_{1-x}$ (0 < x < 1) is used for a surface protection film. It is found that if the composition ratio x becomes large, a film has a larger optical band gap (a gap between energy bands of quantized states), becomes opaque, and becomes unstable, whereas if x becomes small, a film has a smaller optical band gap, becomes transparent for the visible light, and has better environment resistance and secular stability.

Then, in order to improve the photosensitivity, it seems preferable to apply a surface protection layer to a photoconducting layer wherein the former is composed of a material with smaller x and is transparent for the visible light, have an optical band gap smaller than that of the latter.

Figure 10:
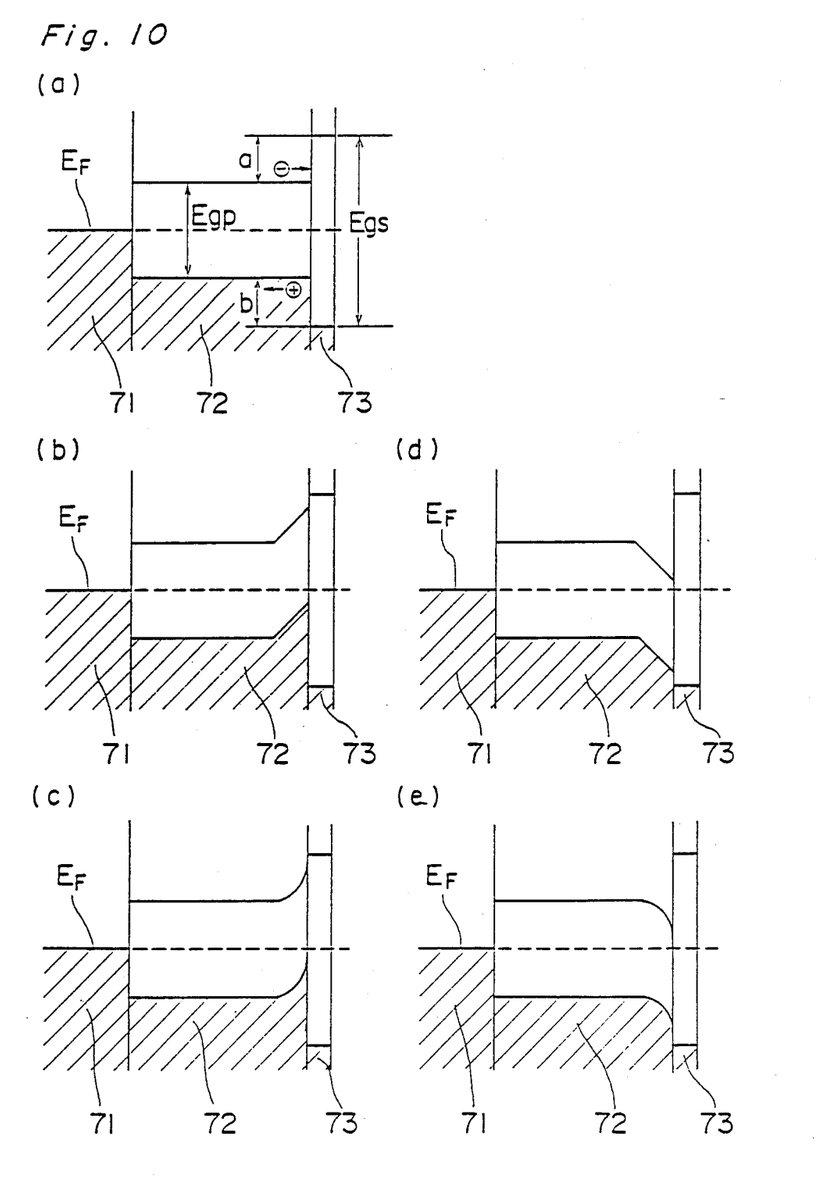

However, the matching of the energy bands between the photoconductive layer and the surface protection layer is not good in such a photoconductive device so that the photoconductive characteristics become worse. FIG. 10(a) shows an energy level scheme in such a situation for a photoconductive device consisting of a metallic substrate 71, a photoconductive layer 72 and a surface protection layer 73. Energy levels are occupied up to the Fermi level $E_F$ in the substrate 71, while energy gaps $E_{gp}$ and $E_{gs}$ ($E_{gp} < E_{gs}$) exist in the photosensitive layer 72 and in the surface protection layer 73, respectively. The bottom of the conduction band of the surface layer 73 is higher by a difference a than that of the photoconductive layer 72, while the top of the valence band of the former 73 is lower by a difference b than that of the latter 72. Then, if photocarriers (designated as + and − in FIG. 10(a)) are generated by the incident light in the photoconductive layer 72 near the interface with the surface protection layer 73, they cannot move freely. Then, they cannot reach the free surface 106 and form space charges near the interface so that the residual potential increases and the resolution of the electrostatic latent image decreases.

On the contrary, if the photoconductive layer is made of a material having a larger optical energy gap in order to improve the matching of the energy bands, the photosensitivity deteriorates. On the other hand, if the surface protection layer is made of a material having smaller optical energy gap, the charge acceptance, and the environment resistance and the secular stability deteriorate.

The inventors can produce a photoconductive device coated with a surface protection layer which satisfy the abovementioned requirements at the same time even if the optical gap in the photoconductive layer is smaller than the counterpart in the surface protection layer. This problem can be solved by controlling the type of the carriers near the interface in the photoconductive layer or by varying the Fermi energy appropriately so that photocarriers generated near the interface in the photoconductive layer can reach the free surface of the surface protection layer.

As shown in FIG. 10(b), (c), if the concentration of acceptors (for example, IIIb elements) is increased linearly or nonlinearly near the interface, the conduction band and the valence band will become higher. On the other hand, as shown in FIG. 10(d), (e), if the concentration of doners (for example, Vb elements) is increased linearly or nonlinearly near the interface, the conduction band and the valence band will become higher. Thus, the control of the concentration of the dopant near the interface allows the energy bands to match near the interface.

Then, the photocarriers generated near the interface are allowed to reach the free surface smoothly due to the existence of the slope of the conduction and valence bands, even if the surface protection layer is made of a material having a larger optical band gap. In practical use, for example, for a xerographic photoconductor, the applied electric voltage shifts the energy levels and helps the matching of the energy bands. Thus, no residual potential arises, and the resolution of an electrostatic latent image becames high, and blurred images in a copy do not appear. Furthermore, the photoconductive material is superior in the capability of sustaining charges, the environment resistance and the secular stability.

EXAMPLE 2

A photoconductive device having a surface protection layer is produced as follows.

A photoconductive layer 102 is deposited as follows. Silane, hydrogen and diborane contained in gas cylinders 20, 21, 22 are allowed to flow constantly in the reaction chamber 1 as mentioned above so that the ratio of the concentration of diborane to silane is $10^{-4}$. The application of high frequency voltage generates the glow discharge, and a-Si film is deposited on the conductive substrate 104.

After the deposition continues for 7.5 hours, the amount of diborane introduced in the reaction chamber 1 is increased gradually in order to increase the concentration of positive carriers. That is, the control knob of the mass flow controller 42 is kept on turning. After that, the high frequency power source 6 is turned off immediately. The ratio of the concentration of diborane to that of silane is $5 \times 10^{-3}$ just before the turn off. Thus, a photoconductive layer 102 is formed on the conductive substrate 102 wherein the concentration of boron becomes maximum around the surface.

As for the SN ratio and the photosensitivity of the a-Si photoconductive layer 102, a person skilled in the art can easily control the values appropriately, for example, by adding a small amount of oxygen, methane or ammonia.

Next, a surface projection layer 103 is formed with the glow discharge process. The composition of the gases introduced in the reaction chamber 1 is as follows. A predetermined amount of oxygen from the gas cylinder 29 is introduced under the control of the mass flow controller 49 after opening the valves 39 and 13. In order to make the flow rate of diborane appropriate, diborane gas from the gas cylinder 23 is introduced under the control of the mass flow controllers 43 after opening the valve 33 as well as silane gas from the gas cylinder 20 under the control of the mass flow controller 40 after opening the valve 30.

If the volume ratio of oxygen to silane is set between 0.5 and 2.0, a surface protection film 103 becomes more insulating, while if the ratio is set between 0.01 and 0.5, it becomes more photoconductive.

Table 1 shows electrophotography characteristics of a photoconductive device produced as mentioned above as well as those of a prior photoconductive device wherein the concentration of boron in the photoconduction layer 102 is constant.

TABLE 1

|  | Ex. 2 | Prior art |
| --- | --- | --- |
| Surface potential | 430 V | 430 V |
| Residual potential | 20 V | 100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the environment resistance, the secular stability and blurred images in a copy.

Figure 11:
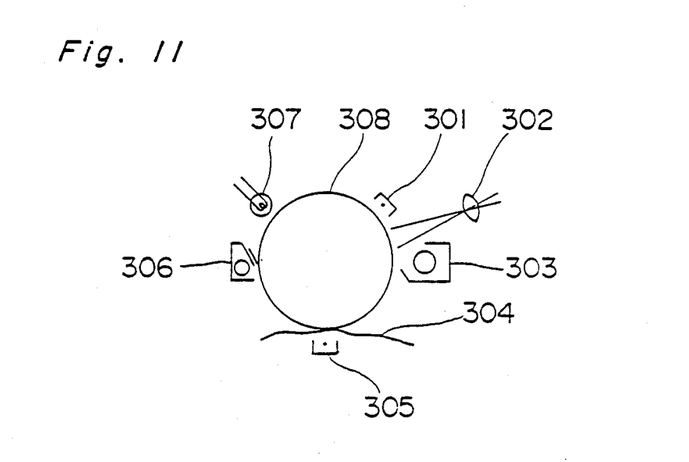
FIG. 11 is a diagram of an electrophotography apparatus.

The photoconductive device is used in the electrophotography process in such an apparatus as shown in FIG. 11. A photoconductive device is coated on a drum 308. In the electrophotography process, a first charger (6.0 kV) 301 applies a voltage on the drum 308 rotating clockwise. An image on a manuscript is exposed through a lens 302 on the drum 308. The exposed image is developed with a developer 303, and then it is transferred on a transfer paper 304. After the transfer, the drum 308 is cleaned with a cleaner 506, and it is discharged with a source of light 306.

As shown in FIG. 3, an undercoat layer 105 can be interposed between the substrate 104 and the photoconductive layer 102. An undercoat layer on which a photcconductive layer will be applied may be composed of a-Si containing at least oxygen, nitrogen or carbon, and can be formed in a similar process to that of forming a surface protection layer.

A photoconductive device produced in this Example and following Examples 3 and 4 is especially useful when the photocarriers generated in the photosensitive layer on the illumination should move freely. In order for a photoconductive material having positive dopants to make photosensitive, the free surface should be charged positively. Otherwise, the photosensitivity characteristics of a photoconductive device cannot be shown fully. In the photoconductive device mentioned above, photogenerated electrons pass easily the photoconduct layer under the applied external field due to the abovementioned slope of the energy diagram (FIG. 10) near the interface with the surface protection layer, and cancel the charges in the free surface.

On the contrary, if the free surface is charged negatively, photogenerated holes cannot cancel surface charges due to the energy barrier at the interface, and becomes space charges. This has bad influence on the electrophotography process.

FIGS. 12(a)-(f) show preferable examples of the consentration of boron (solid line j) and of oxygen (dashed line k) plotted against the distance in the direction of the thickness of a photoconductive device, wherein X and Y represent the surface of the conductive substrate 104 and the free surface 106, respectively.

As shown in FIGS. 12(a)-(f), the slope of boron concentration (j) around the interface between the photoconductive layer 102 and the surface protection layer 103 may be linear or be curved with a constant curvature. The concentration of oxygen (k) may also have a slope around the interface. As for the interface between the photoconductive layer 102 and the undercoat layer 105 both concentrations may also have a slope.

Figure 12:
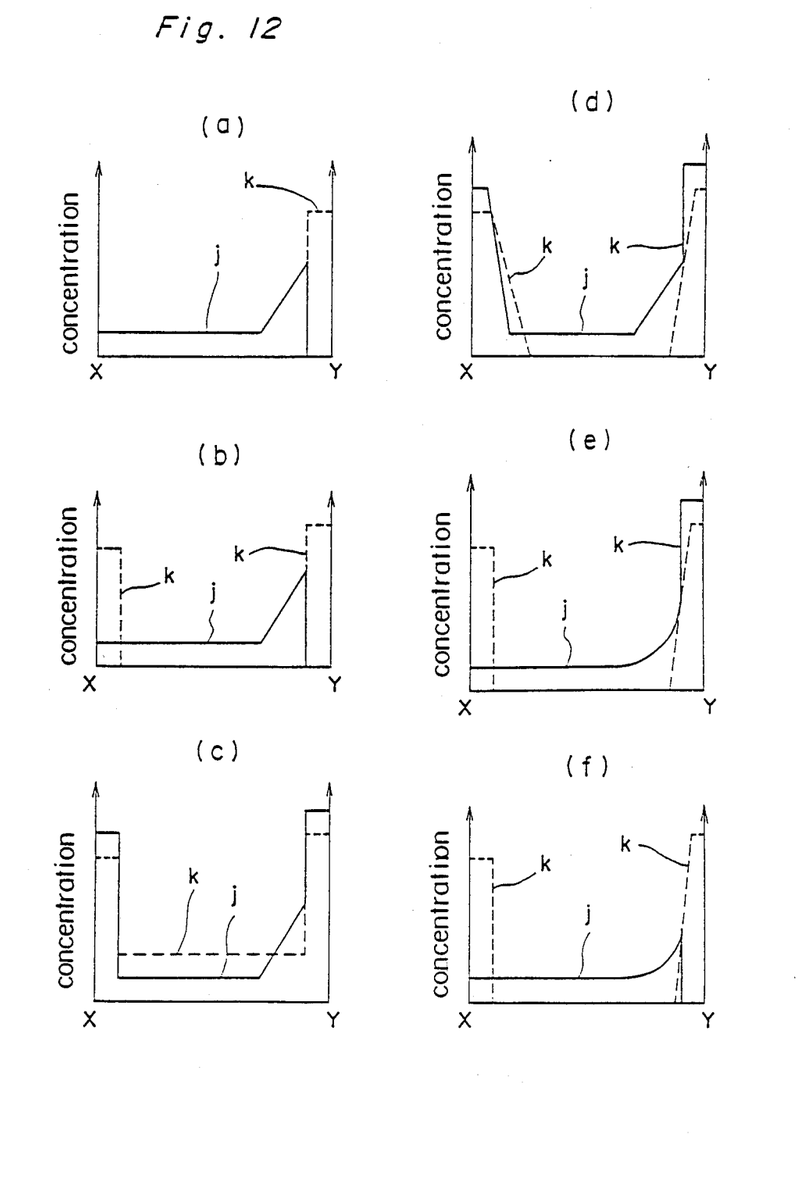

In a photoconductive device shown in FIG. 12(a), the boron concentration in the photosensitive layer 102 is constant except near the surface protection layer 103 wherein it increases linearly, while the oxygen concentration in the surface protection layer is constant. This structure corresponds with that of the abovementioned Example 2.

A photoconductive device shown in FIG. 12(b) is the same with that shown in FIG. 12(a) except that an undercoat layer 105 containing both oxygen and boron is deposited on the substrate 104. In the undercoat layer 105, the concentration of boron is much larger than that of oxygen.

In a photoconductive device shown in FIG. 12(c) the concentration of oxygen is much larger in both undercoat layer 105 and surface protection layer 103 than in the photoconductive layer 102. The boron concentration is larger in both undercoat layer 105 and surface protection layer 103, while smaller in the photoconductive layer 102 except near the surface protection layer 103 wherein it increases linearly.

In a photoconductive device shown in FIG. 12(d), the oxygen concentration in the layer 105 and the surface protection layer 103 decreases to zero continuously with a slope near the interfaces with the photosensitive layer 102. The boron concentration in the layer 105 and the surface protection layer 103 is larger than the boron concentration. The boron concentration decreases continuously to a constant value near the interface between the photoconductive layer 102 and the undercoat layer 105, and increases again with a slope near the interface with the surface protection layer 103.

In a photoconductive device shown in FIG. 12(e), the oxygen concentration in the surface protection layer 103 decreases continuously to zero with a slope near the interface with the photoconductive layer 102. The oxygen concentration in the undercoat layer 105 is much larger than the boron concentration. The boron concentration in the photoconductive layer 102 increases with a curve near the interface with the surface protection layer 103, and it becomes larger than the oxygen concentration in the surface protection layer 103.

A photosensitive device shown in FIG. 12(f) has the same structure as in FIG. 12(e) except that the surface protection layer 103 does not contain boron.

EXAMPLE 3

A photoconductive device similar to that of Example 2 is produced as follows. It contains nitrogen instead of oxygen in the surface protection layer 103.

A photoconductive layer 102 is deposited on a conductive substrate 104 in the same process as that explained in Example 2. As for the SN ratio and the photosensitivity of the a-Si photoconductive layer 102, a person skilled in the art can easily control the values appropriately, for example, by adding a small amount of oxygen, methane or ammonia.

Next, a surface protection layer 103 is formed with the glow discharge process. The composition of the gases introduced in the reaction chamber 1 is as follows. A predetermined amount of ammonia from the gas cylinder 25 is introduced under the control of the mass flow controller 45 after opening the valve 35. In order to make the flow rate of diborane appropriate, diboran gas from the gas cylinder 23 is introduced under the control of the mass flow controller 43 after opening the valve 33 as well as silane gas from the gas cylinder 20 under the control of the mass flow controller 40 after opening the valve 30.

If the volume ratio of ammonia to silane is set between 0.5 and 2.0, a surface protection film 103 becomes more insulating, while if the ratio is set between 0.01 and 0.5, it becomes more photoconductive.

Table 2 shows electrophotography characteristics of a photoconductive device produced as mentioned above as well as those of a prior photoconductive device wherein the concentration of boron in the photoconductive layer 102 is constant.

TABLE 2

|  | Ex. 3 | Prior art |
| --- | --- | --- |
| Surface potential | 390 V | 380 V |
| Residual potential | 20 V | 100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the enviroment resistance, the secular stability and the blurred images in a copy.

As shown in FIG. 3, an undercoat layer 105 can be interposed between the substrate 104 and the photoconductive layer 102. An undercoat layer on which a photoconductive layer will be applied may be composed of a-Si containing at least oxygen, nitrogen, and can be formed in a similar process to that of forming a surface protection layer.

FIGS. 12(a)-(f) show also preferable examples of the concentration of boron (solid line j) and of nitrogen (dashed line k) plotted against the distance in the direction of the thickness of a photoconductive device.

EXAMPLE 4

A photoconductive device similar to that of Example 2 is produced as follows. It contains carbon instead of oxygen in the surface protection layer 103.

A photoconductive layer 102 is deposited on a conductive substrate 104 in the same process as that explained in Example 2. As for the SN ratio and the photosensitivity of the a-Si photoconductive layer 102, a person skilled in the art can easily control the values appropriately, for example, by adding a small amount of oxygen, methane or ammonia.

Next, a surface protection layer 103 is formed with the glow discharge process. The composition of the gases introduced in the reaction chamber 1 is as follows. A predetermined amount of methane from the gas cylinder 26 is introduced under the control of the mass flow controller 46 after opening the valve 36. In order to make the flow rate of diborane appropriate, diborane gas from the gas cylinder 23, is introduced under the control of the mass flow controller 43 after opening the valve 33 as well as silane gas from the gas cylinder 20 under the control of the mass flow controller 40 after opening the valve 30.

If the volume ratio of methane to silane is set between 0.5 and 2.0, a surface protection film 103 becomes more insulating, while if the ratio is set between 0.01 and 0.5, it becomes more photoconductive.

Table 3 shows electrophotography characteristics of a photoconductive device produced as mentioned above as well as those of a prior photoconductive device wherein the concentration of boron in the photoconductive layer 102 is constant.

TABLE 3

|  | Ex. 4 | Prior art |
|---|---|---|
| Surface potential | 450 V | 440 V |
| Residual potential | 20 V | 100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the environment resistance, the secular stability and the blurred images in a copy.

As shown in FIG. 3, an undercoat layer 105 can be interposed between the substrate 104 and the photoconductive layer 102. An undercoat layer on which a photoconductive layer will be applied may be composed of a-Si containing at least oxygen, nitrogen, or carbon, and can be formed in a similar process to that of forming a surface protection layer.

FIGS. 12(a)-(f) show also preferable examples of the concentration of boron (solid line j) and of carbon (dashed line k) plotted against the distance in the direction of the thickness of a photoconductive device.

EXAMPLE 5

A photoconducting material similar to that of Example 2 is produced as follows. It contains nitrogen instead of oxygen in the surface protection layer.

A photoconductive layer 102 is deposited on a conductive substrate 104 in the same process as that explained in Example 2. As for the SN ratio and the photosensitivity of the a-Si photoconductive layer 102, a person skilled in the art can easily control the values appropriately, for example, by adding a small amount of oxygen, methane or ammonia.

After the deposition continues for 7.5 hours, the amount of diborane introduced in the reaction chamber 1 is decreased gradually in order to change the carrier type to n-type. On the other hand, phosphor is provided under the control of the mass flow controller 44 after opening the valve 34. That is, the control knob of the mass flow controller 42 and 44 are kept on turning during about thirty minutes in the direction of the decrease and of the increase in the flow rate, respectively. After that, the high frequency power source 6 is turned off immediately. The ratio of the concentration of diborane to that of silane is $5 \times 10^{-3}$ just before the turn off.

Thus, a photoconductive layer 102 is formed on the conductive substrate 102 wherein the concentration of carbon becomes maximum around the surface.

Next, a surface protection layer 103 is formed with the glow discharge process. The composition of the gases introduced in the reaction chamber is as follows. A predetermined amount of ammonia from the gas cylinder 25 is introduced under the control of the mass flow controller 45 after opening the valve 35. In order to make the flow rate of phosphine appropriate, phosphine gas from the gas cylinder 24, is introduced under the control of the mass flow controller 44 after opening the valve 34 as well as silane gas from the gas cylinder 20 under the control of the mass flow controller 40 after opening the valve 30.

If the volume ratio of ammonia to silane is set between 0.5 and 2.0, a surface protection film 103 becomes more insulating, while if the ratio is set between 0.01 and 0.5, it becomes more photoconductive.

Table 4 shows electrophotography characteristics of a photoconductive device produced as mentioned above as well as those of a prior photoconductive device wherein the concentration of phosphor in the photoconduction layer 102 is constant.

TABLE 4

|  | Ex. 5 | Prior art |
|---|---|---|
| Surface potential | −400 V | −400 V |
| Residual potential | −20 V | −100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the environment resistance, the secular stability and the blurred images in a copy.

As shown in FIG. 3, an undercoat layer 105 can be interposed between the substrate 104 and the photoconductive layer 102. An undercoat layer on which a photoconductive layer will be applied may be composed of a-Si containing at least oxygen, nitrogen, and can be formed in a similar process to that of forming a surface protection layer.

A photoconductive device produced in this Example and following Examples 6 and 7 is especially useful when the photocarriers generated in the photosensitive layer with the illumination should move freely. In order to make a photoconductive material added with negative dopants photosensitive, the free surface should be charged negatively. Otherwise, the photosensitivity characteristics of a photoconductive device cannot be shown fully. In the photoconductive device mentioned above, photogenerated holes pass easily the photosensitive layer under the applied external field through the abovementioned slope of the energy diagram near the interface with the surface protection layer, and cancel the charges in the free surface.

On the contrary, if the free surface is charged negatively, photogenerated electrons cannot cancel surface charges due to the energy carrier at the interface, and becomes space charges. This has bad influence on the electrophotography process.

FIGS. 13(a)-(f) show preferable examples of the concentration of phosphor (solid line l) and of nitrogen (dashed line m) plotted against the distance in the direction of the thickness of a photoconductive material, wherein X and Y represent the surface of the conductive substrate 104 and the free surface 106 of a phtoconductive device, respectively.

As shown in FIGS. 13(a)-(f), the slope of phosphor concentration (l) around the interface between the photoconductive layer 102 and the surface protection layer 103 may be linear or be curved with a constant curvature. The concentration of nitrogen (m) may also have a slope around the interface. As for the interface between the photoconductive layer 102 and the undercoat layer 105 both concentrations may also have a slope.

Figure 13:
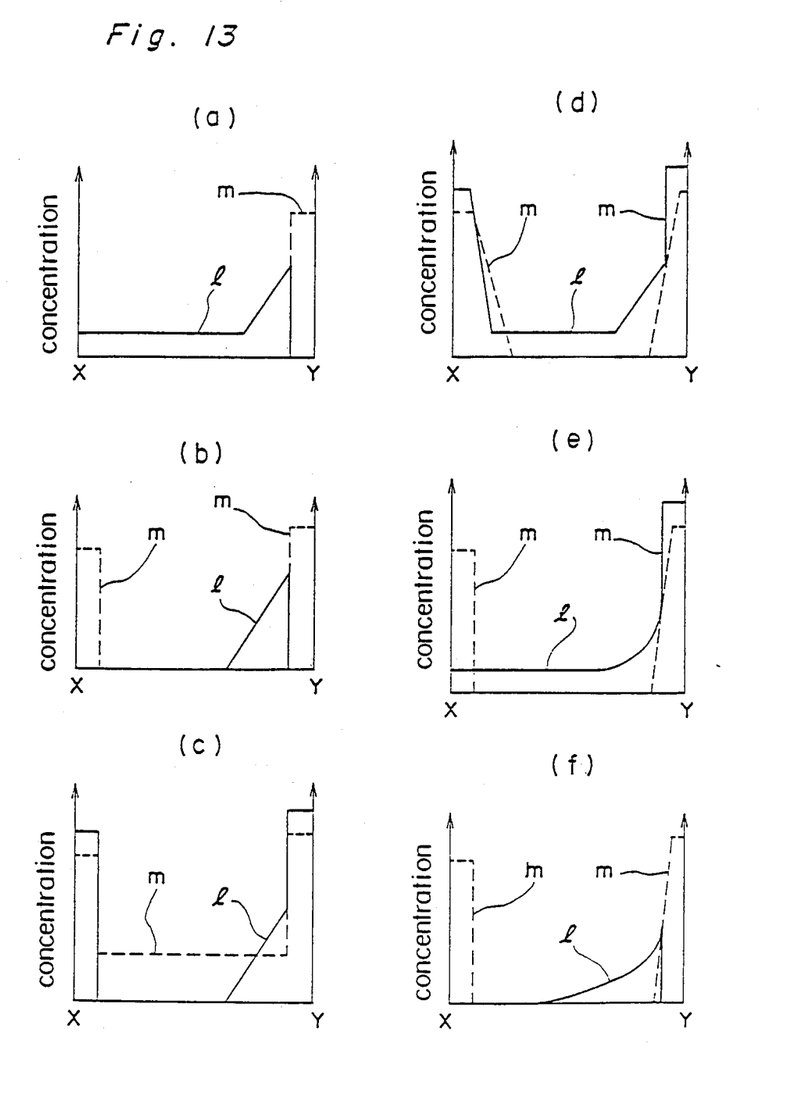

In a photoconductive device shown in FIG. 13(a), the phosphor concentration in the photoconductive layer 102 is constant except near the surface protection layer 103 wherein it increases linearly, while the nitrogen concentration in the surface protection layer is constant.

A photoconductive device shown in FIG. 13(b) is the same with that shown in FIG. 13(a) except that the undercoat layer 105 containing both nitrogen and phosphor is deposited on the substrate 104 and that the phosphor is added only near the interface with the surface protection layer 103. This structure corresponds with that of the abovementioned Example 2 except the addition of nitrogen in the undercoat layer 105.

In a photoconductive device shown in FIG. 13(c) the concentration of nitrogen is much larger in both undercoat layer 105 and surface protection layer 103 than in the photoconductive layer 102. The phosphor concentration is larger in both undercoat layer 105 and surface protection layer 103, while smaller in the photoconduct layer 102 except near the surface protection layer 103 wherein it increases linearly.

In a photoconductive device shown in FIG. 13(d), the nitrogen concentration in the undercoat layer 105 and the surface protection layer 103 decreases to zero continuously with a slop near the interfaces with the photoconductive layer 102. The phosphor concentration in the undercoat layer 105 and the surface protection layer 103 is larger than that in the photoconductive layer 102. The phosphor concentration decreases continuously to a constant value near the interface between the photoconductive layer 102 and the undercoat layer 105, and increases again with a slope near the interface with the surface protection layer 103.

In a photoconductive device shown in FIG. 13(e), the nitrogen concentration in the surface protection layer 103 decreases continuously to zero with a slope near the interface with the photoconductive layer 102. The nitrogen concentration in the undercoat layer 105 is much larger than the phosphor concentration. The phosphor concentration in the photoconduct layer 102 increase with a curve near the interface with the surface protection layer 103, and it becomes larger than the nitrogen concentration in the surface protection layer 103.

A photosensitive device shown in FIG. 13(f) has a similar structure to that in FIG. 13(b). The phosphor concentration is curved near the interface with the surface protection layer 103, and the nitrogen concentration has a linear slope hear the interface.

EXAMPLE 6

A photoconductive device similar to that of Example 5 is produced as follows. It contains carbon instead of nitrogen in the surface protection layer 103.

A photoconductive layer 102 is deposited on a conductive substrate 104 in the same process as that explained in Example 2. As for the SN ratio and the photosensitivity of the a-Si photoconductive layer 102, a person skilled in the art can easily control the values appropriately, for example, by adding a small amount of oxygen, methane or ammonia.

Next, a surface protection layer 103 is formed with the glow discharge process. The composition of the gases introduced in the reaction chamber is as follows. A predetermined amount of methane from the gas cylinder 26 is introduced under the control of the mass flow controller 46 after opening the valves 36. In order to make the flow rate of phosphine appropriate, phosphine gas from the gas cylinder 24 is introduced under the control of the mass flow controller 44 after opening the valve 34 as well as silane gas from the gas cylinder 20 under the control of the mass flow controller 40 after opening the valve 30.

If the volume ratio of methane to silane is set between 0.5 and 2.0, a surface protection film 103 becomes more insulating, while if the ratio is set between 0.01 and 0.5, it becomes more photoconductive.

Table 5 shows electrophotography characteristics of a photoconductive device produced as mentioned above as well as those of a prior photoconductive device wherein the concentration of boron in the photoconduction layer 102 is constant.

TABLE 5

|  | Ex. 6 | Prior art |
| --- | --- | --- |
| Surface potential | −440 V | −430 V |
| Residual potential | −20 V | −100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the environment resistance, the secular stability and the blurred images in a copy.

As shown in FIG. 3, an undercoat layer 105 can be interposed between the substrate 104 and the photoconductive layer 102. An undercoat layer on which a photoconductive layer will be applied may be composed of a-Si containing at least oxygen, and can be formed in a similar process to that of forming a surface protection layer.

FIGS. 13(a)-(f) show also preferable examples of the concentration of phosphor (solid line l) and of carbon (dashed line m) plotted against the distance in the direction of the thickness of a photoconductive device.

EXAMPLE 7

A photoconductive device similar to that of Example 5 is produced as follows. It contains oxygen instead of nitrogen in the surface protection layer 103.

A photoconductive layer 102 is deposited on a conductive substrate 104 in the same process as that explained in Example 2. As for the SN ratio and the photosensitivity of the a-Si photoconductive layer 102, a person skilled in the art can easily control the values appropriately, for example, by adding a small amount of oxygen, methane or ammonia.

Next, a surface protection layer 103 is formed with the glow discharge process. The composition of the gases introduced in the reaction chamber 1 is as follows. A predetermined amount of oxygen from the gas cylinder 29 is introduced under the control of the mass flow controller 49 after opening the valves 39 and 13. In order to make the flow rate of phosphine appropriate, phosphine gas from the gas cylinder 24 is introduced under the control of the mass flow controller 44 after opening the valve 34 as well as silane gas from the gas cylinder 20 under the control of the mass flow controller 40 after opening the valve 30.

If the volume ratio of oxygen to silane is set between 0.5 and 2.0, a surface protection film 103 becomes more insulating, while if the ratio is set between 0.01 and 0.5, it becomes more photoconductive.

Table 6 shows electrophotography characteristics of a photoconductive device produced as mentioned above as well as those of a prior photoconductive device wherein the concentration of boron in the photoconduction layer 102 is constant.

TABLE 6

|  | Ex. 7 | Prior art |
|---|---|---|
| Surface potential | −460 V | −440 V |
| Residual potential | −20 V | −100 V |
| Environment resistance | excellent | excellent |
| Secular stability | excellent | good |
| Blurred images | excellent | not acceptable |

The photoconducting device according to the present invention is found to have very low residual potential. It is also found to have excellent characteristics for electrophotographic process such as the environment resistance, the secular stability and the blurred images in a copy.

As shown in FIG. 3, an undercoat layer 105 can be interposed between the substrate 104 and the photoconductive layer 102. An undercoat layer on which a photoconductive layer will be applied may be composed of a-Si containing at least oxygen, nitrogen, or carbon, and can be formed in a similar process to that of forming a surface protection layer.

FIGS. 13(a)-(f) show also preferable examples of the concentration of phosphor (solid line l) and of oxygen (dashed line m) plotted against the film distance in the direction of the thickness of a photoconductive device.

EXAMPLE 8

Another type of photoconductive device of a triple layer structure shown in FIG. 2 is formed as follows, wherein the concentration of the dopant such as boron is kept constant in the photoconductive layer while the surface protection layer contains oxygen and boron.

A photoconductive layer 102 deposited on a conductive plate 104 in a similar process to that in Example 2 during about eight hours. The boron concentration is kept constant in the photoconductive layer 102. Then, a surface protection layer 103 is deposited on the photoconductive layer 102. Eight samples are prepared by varying the amount of oxygen in the surface protection layer.

Table 7 shows three parameters of the eight samples: the at % ratio (B/Si) of the concentration (at %) of boron atoms to that of silicon atoms, the volume ratio ($O_2/SiH_4$) of oxygen gas to silane gas and the volume ratio ($B_2H_6/SiH_4$) of diborane gas and silane gas introduced in the reaction chamber 1.

The electrography characteristics, the environment resistance and the secular stability of the eight samples are examined with an electrophotography apparatus shown in FIG. 11.

TABLE 7

| sample NO. | B/Si (at %) | $O_2/SiH_4$ | $B_2H_6/SiH_4$ |
|---|---|---|---|
| 1 | 0.001 | 2.0 | $10^{-5}$ |
| 2 | 0.01 | 2.0 | $10^{-3}$ |
| 3 | 0.1 | 2.0 | $10^{-2}$ |
| 4 | $10^{-4}$ | 0.3 | $10^{-5}$ |
| 5 | 0.01 | 0.3 | $10^{-3}$ |
| 6 | $10^{-4}$ | 0.05 | $10^{-5}$ |
| 7 | 0.01 | 0.05 | $10^{-3}$ |
| 8 | $10^{-3}$ | 0 | $10^{-4}$ |

TABLE 8

| sample NO. | total thickness | surface potential | residual potential | environment resistance | secular stability |
|---|---|---|---|---|---|
| 1 | 25 μm | 450 V | 350 V | ⊚ | ⊚ |
| 2 | 25 μm | 440 V | 80 V | ⊚ | ⊚ |
| 3 | 25 μm | 430 V | 20 V | ⊚ | ⊚ |
| 4 | 25 μm | 300 V | 50 V | ○ | ○ |
| 5 | 25 μm | 300 V | 20 V | ○ | ○ |
| 6 | 25 μm | 280 V | 30 V | △ | △ |
| 7 | 25 μm | 280 V | 20 V | △ | △ |
| 8 | 25 μm | 280 V | 20 V | X | X |

⊚: excellent (the characteristic nearly deteriorates when compared with the initial one.)
○: good
△: fair
X: not acceptable The environment resistance is examined by testing electrography characteristics repeatedly under high temperature and high moisture: thus, the environment resistance shown in Table 8 also means the stability. The secular stability is tested by comparing the electrophotography characteristics with the initial one when eleven days have passed after the preparation of the sample.

Table 8 shows that samples No. 1, No. 2 and No. 3 are superior among the eight samples. Thus, it is clear that the surface protection layer contains much oxygen has excellent environment resistance and secular stability. On the other hand, if the surface protection layer contains little oxygen, the surface potential, the environment resistance and the secular stability become worse.

Furthermore, the addition of boron decreases the residual potential. The at % ratios B/Si of the samples No. 1 to No. 3 are 0.001, 0.01 and 0.1, respectively. Thus, it is preferable that the at % ratio B/Si is in the range between $10^{-1}$ and $10^{-3}$.

The amount of oxygen and the at % ratio B/Si can be selected for desirable values easily by a person skilled in the art.

As for the ratio $B_2H_6/SiH_4$, if the ratio is small, the residual potential increases undersirably, whereas if the ratio becomes large, the residual potential decreases preferably.

In the abovementioned samples, boron is doped in the surface protection layers. However, it is found that other IIIb elements can be substituted for boron.

Furthermore, it is found that the characteristics can be improved remarkably if the thickness of the surface protection layer is between 0.01 and 4.0 μm.

This invention may be practiced or embodied in still other ways without departing from the spirit or essential character thereof. The prefered embodiments described herein are therefore illustrative and not restrictive, the scope of the invention being indicated by the appended claims and all variations which come within the meaning of the claims are intended to be embraced therein.

What is claimed as new:

1. A photoconductive device comprising:
   a conductive substrate;
   a photoconductive layer made of amorphous Si:H; and
   a surface protection layer applied on said photoconductive layer which wll not deteriorate the photosensitivity or charge acceptance of said photoconductive layer;
   wherein a dopant is added to said photoconductive layer at least near an interface between said surface protection layer and said photoconductive layer, the concentration of said dopant increasing in a direction perpendicular to and toward said interface, said surface protection layer having an optical energy gap larger than that of said photoconductive layer.

2. A photoconductive device according to claim 1, wherein said concentration of dopant in the photoconductive layer increases linearly in the direction perpendicular to said interface with the surface protection layer.

3. A photoconductive device according to claim 1, wherein said concentration of dopant in the photoconductive layer increases with a curvature in the direction perpendicular to said interface with the surface protection layer.

4. A photoconductive device according to claim 1, wherein said surface protection layer is composed of amorphous silicon containing oxygen, and the concentration of oxygen in the surface protection layer is larger than concentration of the oxygen in the photoconductive layer.

5. A photoconductive device according to claim 4, wherein said dopant is a IIIb element.

6. A photoconductive device according to claim 5, wherein said IIIb element is boron.

7. A photoconductive device according to claim 5, further including a layer composed of amorphous silicon containing at least oxygen, nitrogen or carbon between said conductive substrate and said photoconductive layer.

8. A photoconductive device according to claim 4, wherein said dopant is a Vb element.

9. A photoconductive device according to claim 8, wherein said Vb element is phosphorous.

10. A photoconductive device according to claim 8, further including a layer composed of amorphous silicon containing at least oxygen, nitrogen or carbon between said conductive substrate and said photoconductive layer.

11. A photoconductive material according to claim 1, wherein said surface protection layer is composed of amorphous silicon containing nitrogen, and the concentration of the nitrogen in the surface protection layer is larger than the concentration of the nitrogen in the photoconductive layer.

12. A photoconductive device according to claim 11, wherein said dopant is a IIIb element.

13. A photoconductive device according to claim 12, wherein said IIIb element is boron.

14. A photoconductive device accordrng to claim 12 further including a layer composed of amorphous silicon containing at least oxygen, nitrogen or carbon between said conductive substrate and said photoconductive layer.

15. A photoconductive device according to claim 11, wherein said dopant is a Vb element.

16. A photoconductive device according to claim 15, wherein said Vb element is phosphorous.

17. A photoconductive device acoording to claim 15, further including a layer composed of amorphous silicon containing at least oxygen, nitrogen or carbon between said conductive substrate and said photoconductive layer.

18. A photoconductive device according to claim 1, wherein said surface protection layer is composed of amorphous silicon containing carbon, and the concentration of the carbon in the surface protection layer is larger than the concentration of the carbon in the photoconductive layer.

19. A photoconductive device according to claim 18, wherein said dopant is a IIIb element.

20. A photoconductive material according to claim 19, wherein said IIIb element is boron.

21. A photoconductive device according to claim 19, further including a layer composed of amorphous silicon containing at least oxygen, nitrogen or carbon between said conductive substrate and said photoconductive layer.

22. A photoconductive device according to claim 18, wherein said dopant is a Vb element.

23. A photoconductive device according to claim 22, wherein said Vb element is phosphorous.

24. A photoconductive device according to claim 22, further including a layer composed of amorphous silicon containing at least oxygen, nitrogen or carbon between said conductive substrate and said photoconductive layer.

25. A photoconductive device comprising:
   a conductive substrate;
   a photoconductive layer of amorphous Si:H applied on said conductive substrate; and
   a surface protection layer of amorphous silicon applied on said photoconductive layer;
   wherein said surface protection layer contains oxygen, and is doped with a IIIb element.

26. A photoconductive device according to claim 25, wherein said IIIb element is boron.

27. A photoconductive device according to claim 26, wherein the atomatic % ratio of boron to silicon is between $10^{-3}$ and $10^{-1}$.

28. A photoconductive device according to claim 25, wherein thickness of said surface protection layer is between 0.01 and 4.0 $\mu$m.

* * * * *